United States Patent
Tsorng et al.

(10) Patent No.: US 11,266,035 B1
(45) Date of Patent: Mar. 1, 2022

(54) EXPENDABLE HASSIS LEVER

(71) Applicant: QUANTA COMPUTER INC., Taoyuan (TW)

(72) Inventors: Yaw-Tzorng Tsorng, Taoyuan (TW); Tung-Hsien Wu, Taoyuan (TW); Wei-Jie Chen, Taoyuan (TW); Chia-Hung Kao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/006,179

(22) Filed: Aug. 28, 2020

(51) Int. Cl.
*H05K 7/14* (2006.01)

(52) U.S. Cl.
CPC ......... *H05K 7/1489* (2013.01); *H05K 7/1409* (2013.01)

(58) Field of Classification Search
CPC ........................... H05K 7/1489; H05K 7/1409
See application file for complete search history.

(56) References Cited

U.S. PATENT DOCUMENTS

| | | | | |
|---|---|---|---|---|
| 7,125,272 B1 * | 10/2006 | Liang | ............... | H05K 7/1489 439/160 |
| 7,301,778 B1 * | 11/2007 | Fang | ............... | H05K 7/1409 312/223.2 |
| 7,616,450 B2 * | 11/2009 | Karstens | ............... | H05K 7/1409 361/732 |
| 7,735,669 B2 * | 6/2010 | Liang | ............... | G06F 1/181 220/4.21 |
| 8,416,563 B2 * | 4/2013 | Hou | ............... | H05K 7/1489 361/679.33 |
| 9,420,716 B2 * | 8/2016 | Ivey | ............... | H05K 7/1415 |
| 9,629,263 B2 * | 4/2017 | Katsaros | ............... | H02B 1/36 |
| 9,766,667 B1 * | 9/2017 | Singer | ............... | H05K 7/1409 |
| 10,206,302 B2 * | 2/2019 | Liao | ............... | H05K 7/1417 |
| 10,285,291 B1 * | 5/2019 | Lam | ............... | H05K 7/1489 |
| D856,336 S  * | 8/2019 | Singer | ............... | G06F 1/185 D14/439 |
| 10,939,573 B1 * | 3/2021 | Liao | ............... | H05K 7/1409 |
| 10,973,146 B1 * | 4/2021 | Tsorng | ............... | H05K 7/1489 |
| 2010/0214749 A1 * | 8/2010 | Lee | ............... | H05K 7/1409 361/754 |
| 2018/0168061 A1 * | 6/2018 | Liao | ............... | G06F 1/18 |
| 2019/0008075 A1 * | 1/2019 | Chen | ............... | H05K 7/20727 |

* cited by examiner

*Primary Examiner* — Kimberley S Wright
(74) *Attorney, Agent, or Firm* — Nixon Peabody LLP

(57) ABSTRACT

Extendable lever arms can be used to facilitate insertion and removal of a sled into and out of a chassis. Each extendable lever can include a rotatable body, a primary arm, and a secondary arm. The rotatable body can be rotatably coupled to the housing of the sled, and can optionally include latching elements to secure the sled within the chassis, as well as optional removal features to facilitate disengaging the sled from the chassis. The secondary arm can be coupled to the primary arm to move between a retracted position and an extended position. When in the retracted position, the secondary arm can be positioned adjacent to the primary arm to avoid blocking access to ports of the sled. When in the extended position, however, the secondary arm can be positioned to provide a longer lever arm to facilitate insertion and removal of the sled.

17 Claims, 9 Drawing Sheets

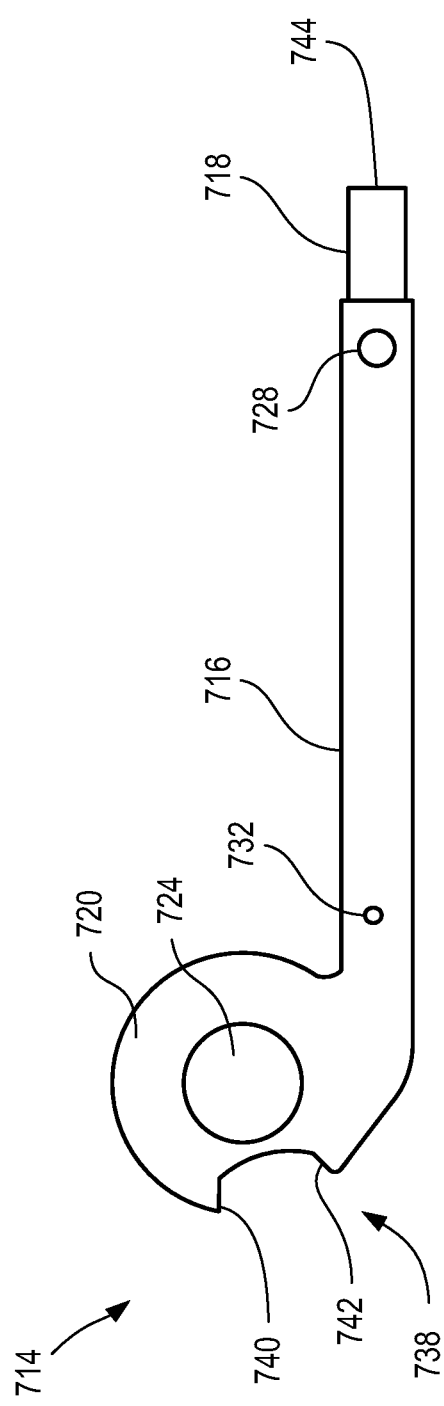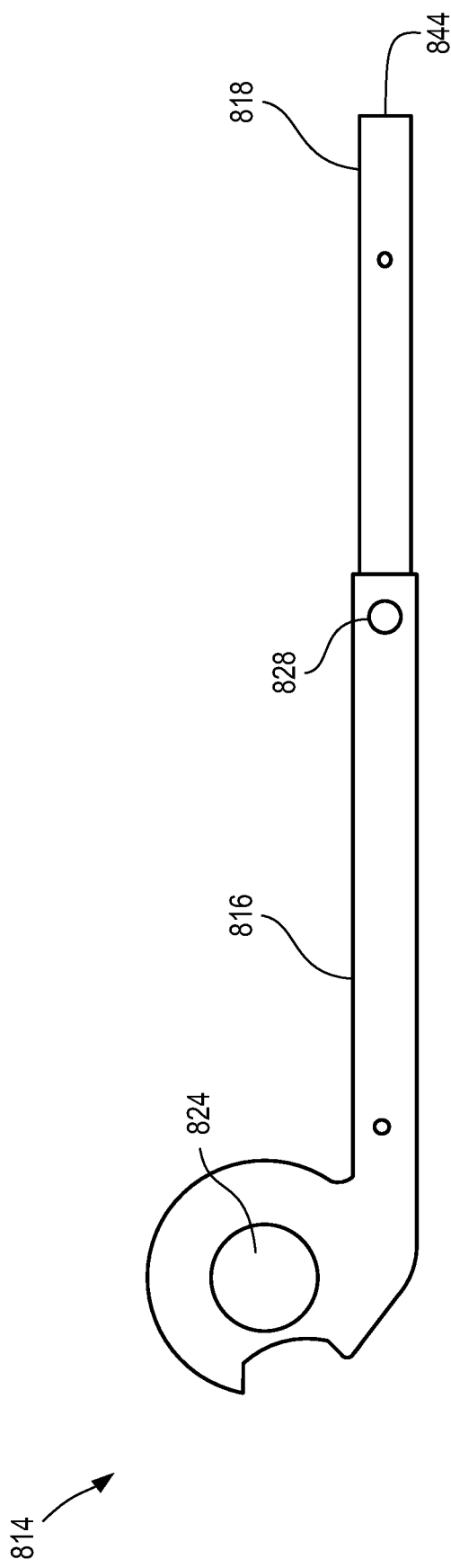

EXPENDABLE HASSIS LEVER

TECHNICAL FIELD

The present disclosure relates to computer hardware generally, and more specifically to levers used to facilitate insertion and/or removal of computer chassis.

BACKGROUND

Computing devices, such as computer servers, often include one or more sleds that are insertable into receiving spaces in a chassis. Insertion and removal of these sleds often involve securing or un-securing the sled within the chassis, as well as optionally coupling connectors on one side of the sled to connectors already present in the chassis. Insertion and/or removal of a sled into and/or out of a receiving space in a chassis can be especially difficult with larger and/or heavier sleds, or with sleds having connectors with high insertion and/or removal forces. There is a need for a sled that can be easily handled, especially during insertion into and/or removal from a chassis.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a sled comprising a housing for supporting a component having an interface (e.g., an input/output (I/O) port). The housing is insertable into a chassis. The sled also includes a cover panel positioned at an end of the housing, wherein the cover panel has an opening for providing external access to the interface. The sled also includes a first extendable lever rotatably coupled to the housing adjacent to a first side of the cover panel and a second extendable lever rotatably coupled to the housing adjacent to a second side of the cover panel that is opposite the first side of the cover panel. Each of the first extendable lever and the second extendable lever comprises: a lever body rotatable about a pivot; a primary arm extending from the lever body; and a secondary arm coupled to the primary arm and movable between a retracted position and an extended position.

In some cases, each of the first extendable lever and the second extendable lever is rotatable between a first position and a second position. In some cases, rotation from the (respective) first position to the (respective) second position facilitates removal of the housing from the chassis. In some cases, each of the first extendable lever and the second extendable lever is rotatable between a first position and a second position. In some cases, rotation from the (respective) second position to the (respective) first position facilitates securing the housing within the chassis.

In some cases, each of the first extendable lever and the second extendable leaver further comprises an engaging feature for mechanically engaging the chassis in response to movement of the extendable lever. In some cases, each engaging feature comprises a latching element configured to engage a (respective) corresponding feature of the chassis to secure the housing within the chassis in response to rotation of the (respective) lever body in a direction that decreases a distance between the cover panel and the (respective) secondary arm. In some cases, each engaging feature comprises a removal feature configured to engage a (respective) corresponding feature of the chassis to facilitate removing the housing from the chassis in response to rotation of the (respective) lever body in a direction that increases a distance between the cover panel and the (respective) secondary arm.

In some cases, each primary arm comprises a securement feature for releasably locking the (respective) secondary arm in the (respective) extended position. In some cases, each securement feature comprises a thumb screw, and each secondary arm comprises a first aperture for receiving the (respective) thumb screw when in the (respective) extended position. In some cases, each secondary arm further comprises a second aperture for receiving the (respective) thumb screw when in the (respective) retracted position.

In some cases, the sled further comprises a first lever securement feature and a second lever securement feature coupled to the housing, wherein each of the first lever securement feature and the second lever securement feature releasably locks the primary arm of respective ones of the first extendable lever and the second extendable lever in a first position. In some cases, each secondary arm is rotatably coupled to the (respective) primary arm at a pivot point adjacent to a distal end of the (respective) primary arm. In some cases, each secondary arm is rotatably coupled to the (respective) primary arm about an axis of rotation that is parallel the (respective) pivot of the (respective) lever body. In some cases, each secondary arm is slidably coupled to the (respective) primary arm. In some cases, the secondary arm of the first extendable lever restricts external access to the interface when in the extended position while the first extendable lever is rotated to an installed position. In some cases, each secondary arm does not restrict external access to the interface when in the (respective) retracted position.

Embodiments of the present disclosure include a method comprising partially inserting a sled into a receiving space of a chassis. The sled comprises a housing for supporting a component having an interface (e.g., an input/output (I/O) port). The housing is insertable into a chassis. The sled also includes a cover panel positioned at an end of the housing, wherein the cover panel has an opening for providing external access to the interface. The sled also includes a first extendable lever rotatably coupled to the housing adjacent to a first side of the cover panel and a second extendable lever rotatably coupled to the housing adjacent to a second side of the cover panel that is opposite the first side of the cover panel. Each of the first extendable lever and the second extendable lever comprises: a lever body rotatable about a pivot; a primary arm extending from the lever body; and a secondary arm coupled to the primary arm and movable between a retracted position and an extended position. The method further comprises applying pushing force to each secondary arm to fully insert and secure the sled within the chassis, wherein applying pushing force comprises rotating the respective primary arm towards the housing, and wherein rotating the primary arm towards the housing causes a respective securement feature of the extendable lever to engage the chassis. The method further comprises retracting each secondary arm and locking the first extendable lever and the second extendable lever to the housing.

In some cases, the method further comprises unlocking the first extendable lever and the second extendable lever from the housing; extending each secondary arm; and applying pulling force to each secondary arm to disengage the sled from the chassis, wherein applying pulling force comprises rotating the respective primary arm away from the housing. In some cases, each of the first extendable lever and the second extendable lever comprises a securement feature for securing the (respective) secondary arm in the (respective) extended position. In some cases, for each of the first extendable lever and the second extendable lever, retracting the (respective) secondary arm comprises disengaging the (respective) securement feature and rotating the (respective) secondary arm about a pivot. In some cases, for each of the first extendable lever and the second extendable lever, retracting the (respective) secondary arm comprises disengaging the (respective) securement feature and sliding the (respective) secondary arm. In some cases, each secondary arm does not restrict external access to the interface when in the (respective) retracted position.

BRIEF DESCRIPTION OF THE DRAWINGS

The specification makes reference to the following appended figures, in which use of like reference numerals in different figures is intended to illustrate like or analogous components.

FIG. 7 is a top view of an extendable lever with a slidable secondary arm in a retracted position, according to certain aspects of the present disclosure.

FIG. 8 is a top view of an extendable lever with a slidable secondary arm in an extended position, according to certain aspects of the present disclosure.

DETAILED DESCRIPTION

Figure 1:
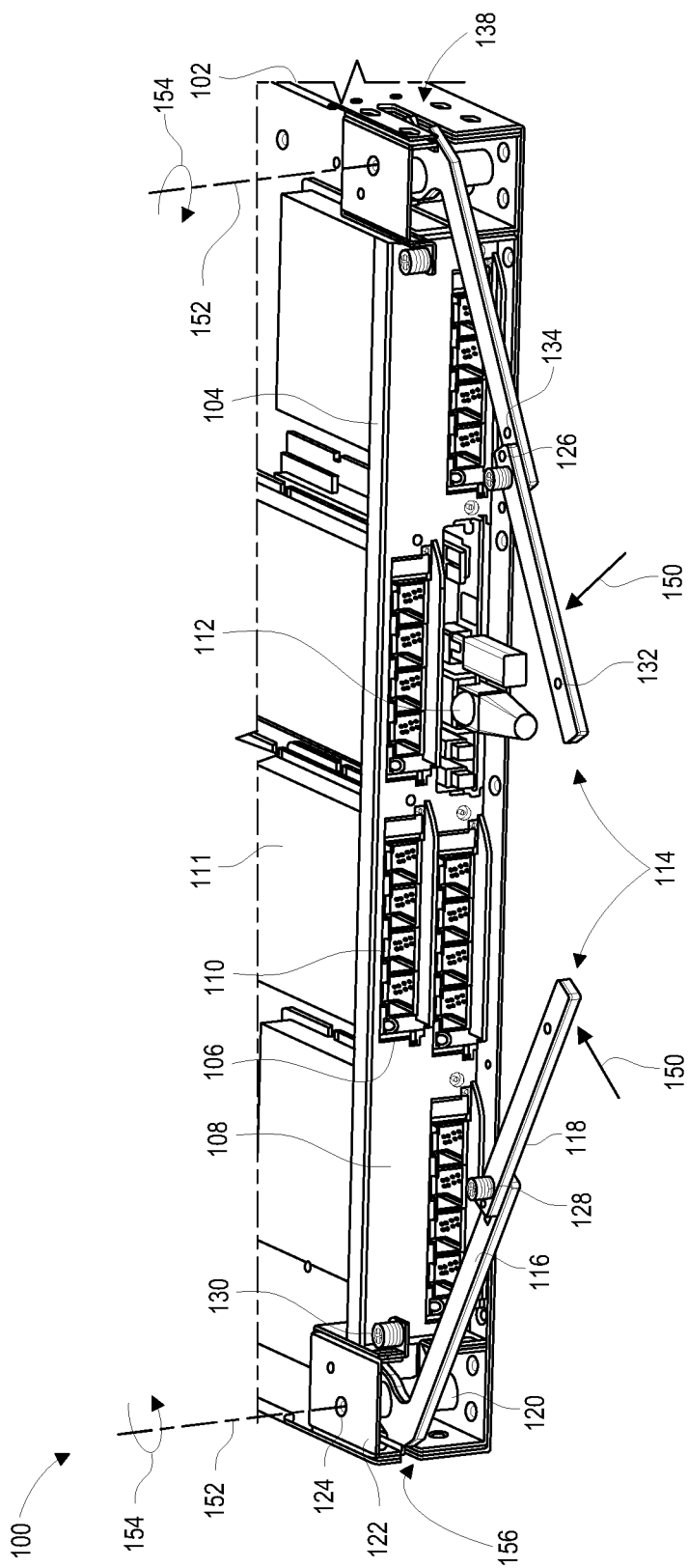
FIG. 1 is an axonometric projection of a sled with extendable levers in an extended configuration, according to certain aspects of the present disclosure.

Certain aspects and features of the present disclosure relate to a sled with extendable lever arms for facilitating insertion and removal of the sled into and out of a chassis. Each extendable lever can include a rotatable body, a primary arm, and a secondary arm. The rotatable body can be rotatably coupled to the housing of the sled, and can optionally include latching elements to secure the sled within the chassis, as well as optional removal features to facilitate disengaging the sled from the chassis. The secondary arm can be coupled to the primary arm to move between a retracted position and an extended position. When in the retracted position, the secondary arm can be positioned adjacent to the primary arm to avoid blocking access to ports of the sled. When in the extended position, however, the secondary arm can be positioned to provide a longer lever arm to facilitate insertion and removal of the sled.

A chassis of a computing system can include one or more receiving spaces for sleds. Each sled can house one or more components of the overall computing system. In some cases, a sled can house a computer (e.g., a server) that makes up a portion of a larger computing system (e.g., a rack of computer servers). As technological demands increase, increasingly larger sleds may be used, as well as sleds with a higher density of components. Heavy sleds can be difficult to manage and handle, especially when inserting or removing the sled from a chassis, when securing the sled in a chassis, and/or when disengaging the sled from a chassis.

In some cases, sleds can be locked or secured in a chassis through the use of latching elements. In some cases, a latching element can be coupled to or made as part of a lever body that rotates about a pivot, with a lever arm extending from the lever body to provide a user with a mechanical advantage when engaging the latching element. The latching element can extend beyond a boundary of the housing of the sled to engage a corresponding feature of the chassis. Thus, the lever can be manipulated to fully pull the sled into the receiving space of the chassis and secure the sled in place.

In some cases, the same lever body can include a removal element that can engage a corresponding feature of the chassis to facilitate removal of the sled from the chassis. Thus, the lever can be manipulated to cause the removal element to engage the corresponding feature of the chassis and push the sled out of the receiving space of the chassis. The lever arm can be used to facilitate this action.

In addition to securing or disengaging the sled to or from the chassis, lever arms can be used as handles to push or pull the sled into or out of the receiving space of the chassis.

Lever arms, however, occupy significant space near the end of the sled. The end of the sled is often used to provide access to components inside the sled. A cover at the end of the sled can include one or more openings that provide external access to an interface of the component(s) within the sled. Any suitable components can be used, with any suitable interface. As used herein with respect to providing external access through a cover at an end of a sled, the term interface can include an input/output (I/O) port, a visual indicator (e.g., light emitting diode, or LED), an air interface (e.g., an air intake), a mechanical interface (e.g., a handle, such as a handle of a removable hard drive), a button or switch, or the like. In an example, a sled can include multiple network interface cards (NICs) that include I/O ports that are externally exposed through openings in the end cover. In another example, a sled can include hot-swappable storage devices that include LEDs, air intakes, and/or handles that are externally exposed through openings in the end cover. In another example, a sled can include open compute project (OCP) cards or other expansion cards that include I/O ports and/or LEDs that are externally exposed through openings in the end cover.

A lever arm must be sufficiently long to provide adequate mechanical advantage to facilitate handling of the sled. If a short lever arm is used, there may be insufficient mechanical advantage to permit a user to easily remove or install the sled, thus increasing risk of injury. However, longer lever arms would normally occupy more exposed space in front of the cover at the end of the sled, thus occluding interfaces exposed through openings in the cover.

Certain aspects of the present disclosure relate to sled levers that are extendable, permitting the lever arm to be extended during installation or removal of the sled, but also permitting the lever arm to be retracted while the sled is installed in the chassis. The lever arm can be comprised of a primary arm and one or more secondary arms. The primary arm can be directly coupled to or otherwise extend from the lever body. The secondary arm(s) can be coupled to the primary arm in a fashion that allows the secondary arm(s) to move between a retracted position and an extended position. When in an extended position, the secondary arm(s) provide a sufficiently long lever arm to provide a mechanical advantage sufficient to facilitate handling of the sled. When in the retracted position, the secondary arm(s) can be positioned within or adjacent to the primary arm, thus occluding less of the cover at the end of the sled when the sled is installed in a chassis. As a result, the sled can be designed to include additional openings in the end cover than would be available if non-extendable levers were used.

Extendable levers can include secondary arms that extend from the primary arms in any suitable fashion, such as sliding or rotating. The secondary arm, once extended, can be used as a handle to grip the lever, such as when applying pulling force (e.g., force applied to pull the secondary lever away from the end cover of the sled) or when applying pushing force (e.g., force applied to push the secondary lever towards the end cover of the sled). In some cases, a secondary arm can be rotatably coupled to a primary arm via a pivot point, such that the secondary arm can rotate between a first position (e.g., a retracted position) adjacent to the primary arm and a second position (e.g., an expanded position) extending from the distal end of the primary arm. In another example, a secondary arm can be slidably coupled to the primary arm, such as positioned around or within the primary arm. In another example, a secondary arm can be rotatably coupled to the primary arm through a hinge that allows the secondary arm to move between a folded position (e.g., a retracted position) and an unfolded position (e.g., an extended position). In some cases, the secondary arm can be parallel the primary arm when in an extended position, although this need not always be the case.

In some cases, a securement feature of the extendable lever can be used to secure the secondary arm in an extended and/or a retracted position. In some cases, the securement feature can be a thumb screw configured to engage a surface of the secondary arm or an aperture of the secondary arm.

As disclosed herein, an extendable lever can rotate between a first position and a second position. When in the first position, also known as an installed position, the extendable lever can be rotated such that the primary arm is adjacent to the cover plate. In this installed position, the latching element can be oriented to engage a corresponding feature of the chassis, thus securing the sled in the chassis. The first position can be achieved by applying pushing force to the extendable lever. The second position can be achieved by applying pulling force to the extendable lever. When in the second position, also known as a removal position, the extendable lever can be rotated such that the primary arm is further spaced apart from the cover plate than when in the first position. In this removal position, the latching element can be withdrawn into the boundaries of the housing of the sled, thereby permitting the sled to be removed from the chassis. In some cases, in the removal position, a removal feature of the extendable lever can engage a corresponding feature of the chassis to facilitate disengaging and removing the sled from the chassis.

In some cases, a surface of the extendable lever (e.g., a surface of the latching element or another surface) can engage a corresponding surface of the housing of the sled when in the removal position, restricting the extendable lever form rotating past the removal position. Thus, the range of rotation of the extendable lever can be limited to maintain an angle between the cover plate and the primary arm and/or secondary arm of at or less than approximately 45°, such as at or less than approximately 45°, 40°, 35°, 30°, 25°, 20°, 15°, or 10°, although other angles can be used. This limitation in the range of rotation of the extendable lever can permit pulling force to be easily applied to the extendable lever in a direction that would facilitate removal of the sled from the chassis.

As disclosed herein, certain aspects and features of the present disclosure may be referred to in the singular or plural with reference to one or more extendable levers. Where appropriate and unless otherwise noted, reference to a single element and extendable lever can be inferred to apply to other corresponding elements on other extendable levers. Likewise, where appropriate and unless otherwise noted, reference to multiple extendable levers or multiple elements on a pair of extendable levers can be inferred to apply to a single element on a single extendable lever. Unless otherwise noted, the aspects and features disclosed herein can be used with a single extendable lever, two extendable levers (e.g., two opposing extendable levers), or more than two extendable levers.

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale.

FIG. 1 is an axonometric projection of a sled 100 with extendable levers 114 in an extended configuration, according to certain aspects of the present disclosure. The sled 100 includes a housing 102 in which one or more components 111 may be supported or installed. The sled 100 can have a front end, a rear end, a first side, a second side, a top, and a bottom. Aspects and features of the present disclosure can be incorporated into a front end or a rear end. The end visible in FIG. 1 can be a front end or a rear end, and will therefore be referred to simply as an end.

The end of the housing 102 can include a cover plate 104. The cover plate 104 can be a separable part coupled to the housing 102 or can be part of the housing 102. The cover plate 104 includes one or more openings 106 through which components 111 of the sled 100 can be externally accessed. As depicted in FIG. 1, the cover plate 104 includes six openings 106 for accessing I/O ports 110 of components 111. External access can be necessary and/or useful for various reasons. In an example, external access to I/O ports 110 can permit cables 112 to be plugged into the I/O ports 110, permitting data and/or power to be transferred between the components 111 and other devices external to the sled 100. In some cases, openings 106 can permit other interfaces of the components 111 to be accessed externally. For example, components 111 may include indicators, such as LEDs, buttons, switches, or mechanical devices, such as handles, which may need to be visible and/or accessible through the cover 104. In order for a component 111 of the sled 100 exposed through the cover plate 104 to be properly accessed, the space adjacent to the cover plate 104 and the component 111 must remain sufficiently open and not occluded by hardware.

In some cases, cover 104 may include occluded spaces 108. Occluded spaces 108 are areas of the cover 104 that do not contain openings 106. Occluded spaces 108 can be used to block undesirable airflow between the external environment and the internal volume of the sled 100.

Sled 100 includes a pair of extendable levers 114, one on each of opposite sides of the sled 100. In some cases, the pair of extendable levers 114 can be known as a left lever and a right lever, such as seen when interacting with the levers, and such as depicted in FIG. 1. Each extendable lever 114 can include a lever body 120 rotatably coupled to the housing 102 about an axis of rotation 152. The extendable lever 114 can be coupled to the housing 104 by a lever body pivot 124 rotatably coupled to, or rotatably captured by, a chassis coupling body 122. The chassis coupling body 122 can be a separate part coupled to the housing 102 or can be part of the housing 102.

Each extendable lever 114 can include a primary arm 116 extending from the lever body 120. The primary arm 116 can be coupled to or be part of the lever body 120. As depicted in FIG. 1, the primary arm 116 and the lever body 120 are formed as a single piece.

Each extendable lever 114 can include a secondary arm 118 coupled to the primary arm 116 to move between a retracted position and an extended position. As depicted in FIG. 1, when the extendable lever 114 is in an extended configuration, the secondary arm 118 is in an extended position. When in the extended position, the secondary arm 118 can be parallel to the primary arm 116, although this need not always be the case. The secondary arm 118 of FIG. 1 is rotatably coupled to the primary arm 116 through a pivot 126. The secondary arm 118 can be secured in the extended position through the use of a secondary arm securement feature 128. In some cases, the secondary arm securement feature 128 is a thumb screw that can pass through an aperture of the secondary arm 118 and into a first aperture of the primary arm 116. In some cases, the primary arm 116 can also include a second aperture 134 positioned to receive the thumb screw when the secondary arm 118 is moved to the retracted position.

As depicted in FIG. 1, the extendable levers 114 are in a removal position, with the extendable levers 114 rotated such that the primary arms 116 are rotated away from the cover plate 104. When in the removal position, the sled 100 can be removed from a receiving space of a chassis. When in the removal position, the sled 100 can be partially inserted into a received space of a chassis, in which case application of pushing force (e.g., force along directions 150) can cause the sled 100 to be fully inserted and installed into the receiving space of the chassis. Application of pushing force would also cause the extendable levers 114 to rotate such that the primary arms 116 rotate towards the cover plate 104.

As disclosed herein, pushing force and pulling force refer to application of force, such as on a secondary arm 118, that correlates to pushing or pulling as if the user is facing the cover plate 104 with the extendable levers 114 positioned between the user and the cover plate 104. For example, application of force along directions 150 is a pushing force. Application of this pushing force can cause the extendable levers 114 to rotate about axes of rotation 152 in directions 154. As depicted in FIG. 1, because the pair of extendable levers 114 include a left lever and a right lever, pushing force applied to both levers causes each lever body 120 to rotate in opposite directions, as depicted by the arrows of directions 154. In some cases, directions 154 can be known as installing directions or installing rotations, since rotation of the lever bodies 120 in directions 154 occurs during installation of the sled 100 in a chassis. Likewise, rotation of lever bodies 120 in directions opposite directions 154 can be known as removal directions or removal rotations, since rotation in those directions occurs during removal of the sled 100 from a chassis. Application of a pulling force (e.g., a force opposite directions 150) can cause each of the extendable levers 114 to rotate in a removal direction.

The housing 102 of the sled 100 can also include a lever securement feature 130 used to secure the lever 114 when the extendable lever 114 has been fully rotated in an installation direction. The lever securement feature 130 can be any suitable feature, such as a thumb screw that can be extended to engage a corresponding surface or aperture of the extendable lever 114. As depicted in FIG. 1, the thumb screw can engage a corresponding aperture 132 of the secondary arm 118. In some cases, however, the aperture can be on the primary arm 116 or both the primary arm 116 and the secondary arm 118. For example, secondary arm 118 can be positioned underneath primary arm 116, rather than above primary arm 116 as depicted in FIG. 1, in which case a thumb screw would engage either the primary arm 116 or both the primary arm 116 and secondary arm 118. This lever securement feature 130 can help secure the extendable lever 114 from rotating in a removal direction (e.g., opposite directions 154), thus helping secure the sled 100 in a chassis.

Each extendable lever 114 can also include an engaging feature 138 coupled to or otherwise extending from the lever body 120. The engaging feature 138 can include a latching element and/or a removal element, which can be extendable past the boundaries of the housing 102, through slot 156, to engage corresponding feature(s) of the chassis. A latching element can engage a corresponding feature of the chassis to secure the sled in the chassis when the sled 100 is inserted into the chassis and the extendable levers 114 are moved into an installed position. A removal element can engage a corresponding feature of the chassis to disengage the sled from the chassis when the sled 100 is fully installed in the chassis and the extendable levers 114 are moved into a removal position.

As depicted in FIG. 1, a latching element of the engaging feature 138 is retracted, at least partially, into the boundaries of the housing 102, while a removal element is extending, at least partially, past the boundaries of the housing 102.

While the extendable levers 114 of FIG. 1 are depicted with a single primary arm 116 and a single secondary arm 118, in some cases, multiple secondary arms can be used to achieve greater expansion (e.g., greater amount of change in length from a retracted position to an expanded position). For example, a first secondary arm can be coupled to the primary arm and a second secondary arm can be coupled to the first secondary arm.

Figure 2:
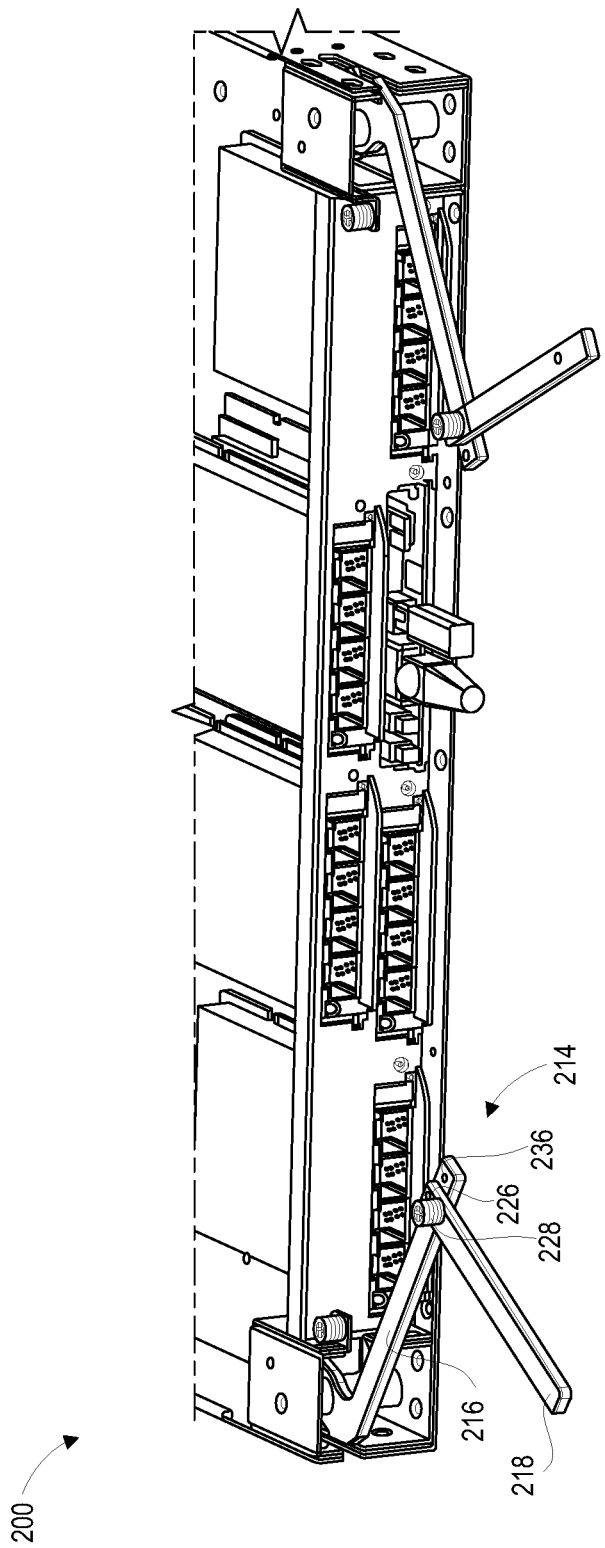
FIG. 2 is an axonometric projection of a sled with extendable levers in a partially extended configuration, according to certain aspects of the present disclosure.

FIG. 2 is an axonometric projection of a sled 200 with extendable levers 214 in a partially extended configuration, according to certain aspects of the present disclosure. Sled 200 can be similar to sled 100 of FIG. 1. As depicted in FIG. 2, the extendable levers 214 are still rotated to a removal position, but the secondary arms 218 are in a partially extended position (e.g., a configuration between a retracted position and an extended position).

To achieve this partially extended position, the securement feature 228 can have been undone or retracted, thus permitting the secondary arm 218 to rotate with respect to the primary arm 216 about pivot 226. As depicted in FIG. 2, the aperture 236, which is engaged by the securement feature 228 when the extendable lever 214 is in a fully extended position, can be seen.

Figure 3:
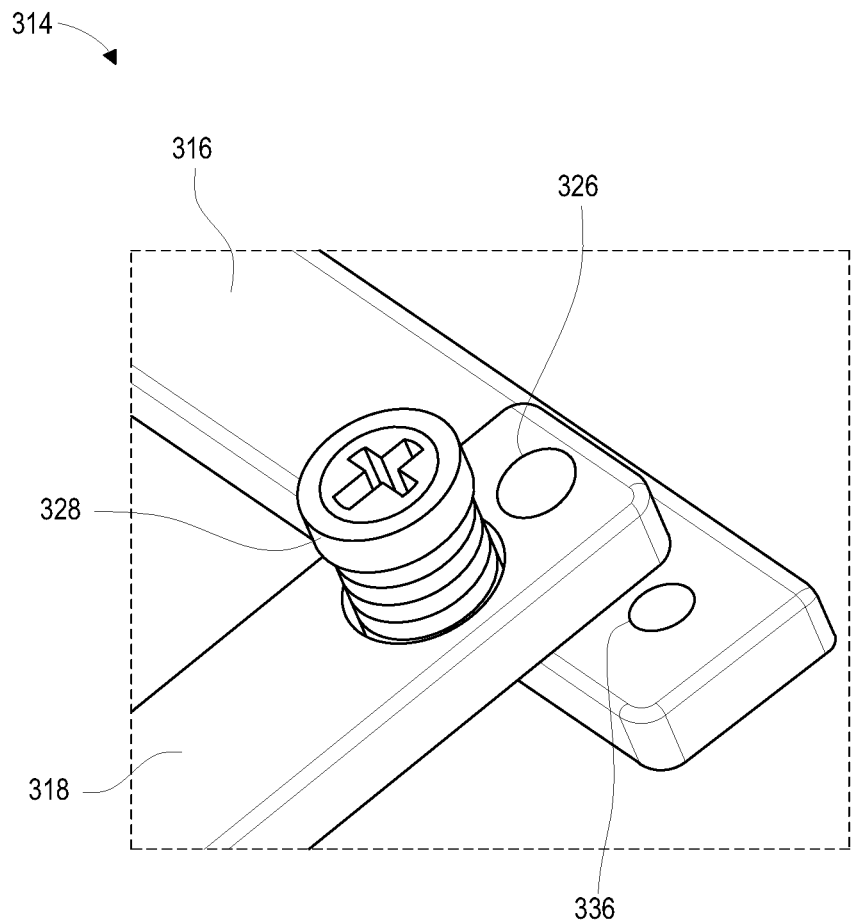
FIG. 3 is an enlarged view of an extendable lever in a partially extended configuration, according to certain aspects of the present disclosure.

FIG. 3 is an enlarged view of an extendable lever 314 in a partially extended configuration, according to certain aspects of the present disclosure. Extendable lever 314 can be similar to extendable lever 214 of FIG. 2. As depicted in FIG. 3, the extendable lever 314 can include a secondary arm 318 coupled to a primary arm 316 about a pivot 326. Pivot 326 can be any suitable mechanism for rotationally coupling the primary arm 316 and secondary arm 318 together, such as a loose rivet, a bushing, or other suitable mechanism. The securement feature 326 is depicted as a thumbscrew coupled to the secondary arm 318. The thumbscrew can be optionally biased away from the secondary arm 318 and/or primary arm 318. The thumbscrew can be screwed down towards the secondary arm 318 and/or primary arm 318, thus causing a protrusion of the thumbscrew to extend past the bottom surface of the secondary arm 318. When the extendable lever 314 is in an extended position, engaging (e.g., screwing down) the thumbscrew can cause the protrusion to extend into the corresponding aperture 336 in the primary arm 316, thus securing the secondary arm 318 from rotation with respect to the primary arm 316 until the thumbscrew is disengaged.

Figure 4:
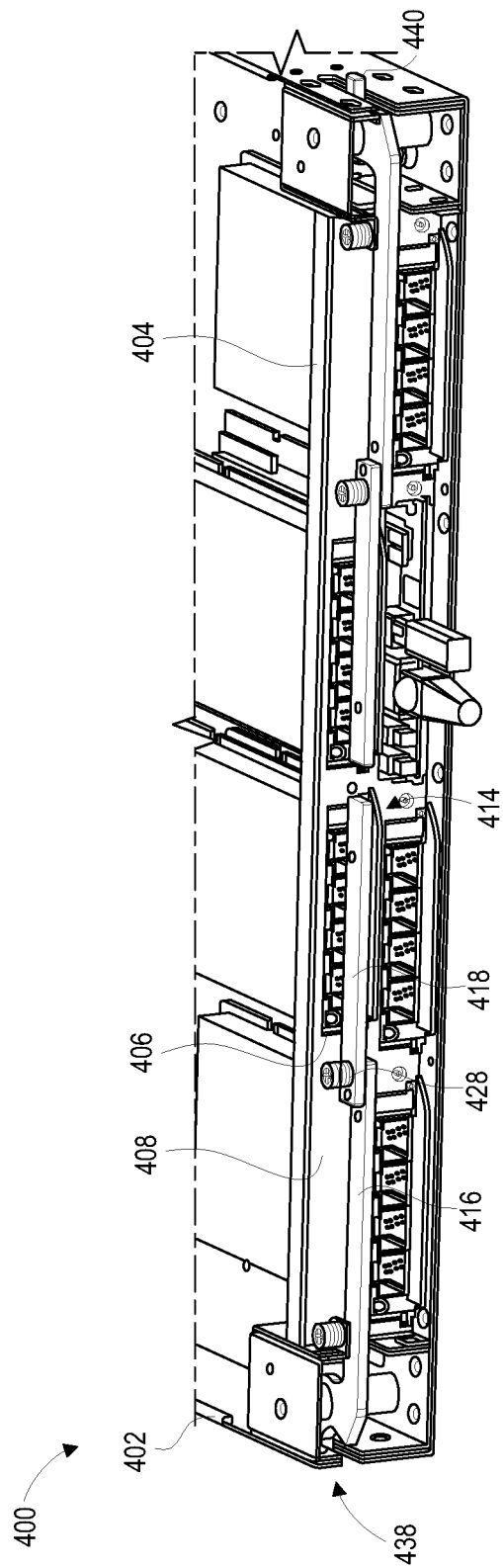
FIG. 4 is an axonometric projection of a sled with extendable levers in an extended configuration and in an installed position, according to certain aspects of the present disclosure.

FIG. 4 is an axonometric projection of a sled 400 with extendable levers 414 in an extended configuration and in an installed position, according to certain aspects of the present disclosure. The sled 400 can be similar to sled 100 of FIG. 1 after its extendable levers 114 have been rotated into an installed position (e.g., rotated in direction 154).

In the installed position, the primary arm 416 of the extendable lever 414 can be positioned adjacent to cover 404. Since the secondary arm 418 is still in an extended position, the secondary arm 418 blocks access to some of the openings 406 of cover 404. As depicted in FIG. 4, a similar sled without extendable arms would not be able to use the top two openings 406, due to this type of occlusion. However, because the extendable levers 414 are able to have the secondary arms 418 move to a retracted position, as described in further detail herein, those top two openings 406 are available for use in sled 400.

When the extendable levers 414 are in the installed position, the latching element 440 of the engaging feature 438 is extended past the boundaries of the housing 402. In this position, the latching elements 440 are able to engage corresponding features of a chassis in which the sled 400 is installed to secure the sled 400 within the chassis.

Figure 5:
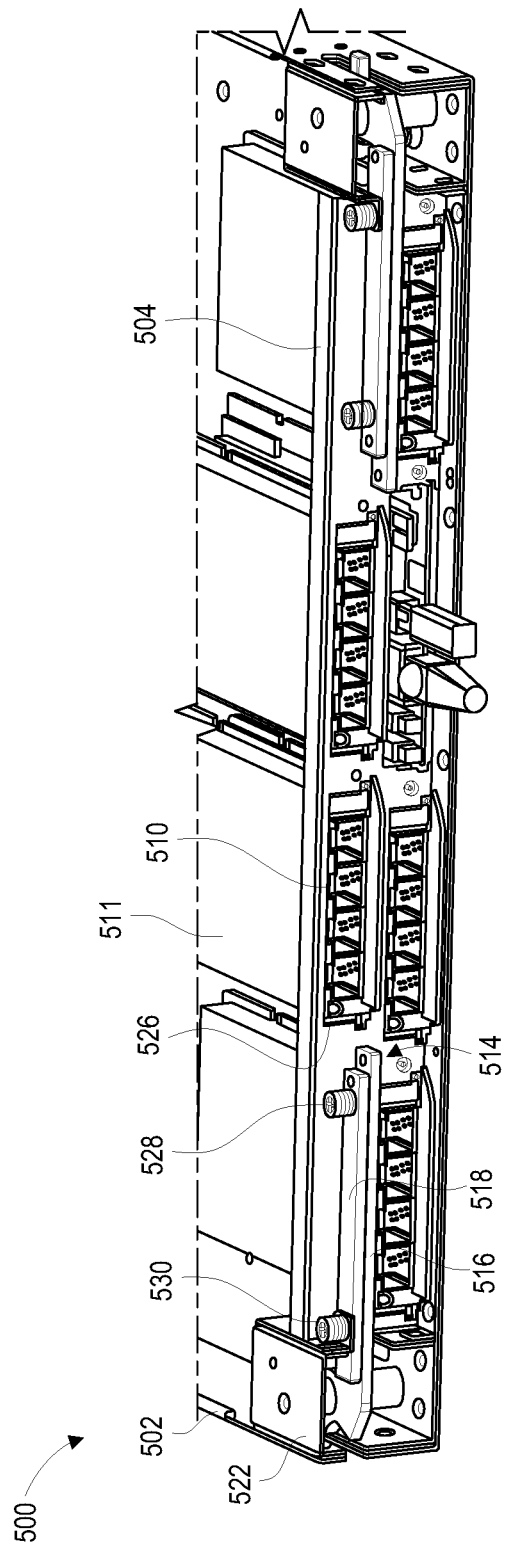
FIG. 5 is an axonometric projection of a sled with extendable levers in a retracted configuration and in an installed position, according to certain aspects of the present disclosure.

FIG. 5 is an axonometric projection of a sled 500 with extendable levers 514 in a retracted configuration and in an installed position, according to certain aspects of the present disclosure. Sled 500 can be similar to sled 400 of FIG. 4, but with the secondary arms 418 moved to a retracted position. Because of the retractable nature of the extendable levers 514, the top openings 526 of the cover 504 can be left available for access, permitting external access to the I/O ports 510 or other interfaces of components 511.

When the extendable lever 514 is in the retracted configuration, the secondary arm 518 of the extendable lever 514 can be positioned adjacent to the primary arm 516, such as directly above the primary arm 516. In other examples, a secondary arm can be positioned below, within, or surrounding a primary arm when the extendable lever 514 is in the retracted configuration. In some cases, securement device 528 can be used to secure the secondary arm 518 in a retracted position. In the example depicted in FIG. 5, the securement device 528 is a thumbscrew that includes a protrusion that extends through the secondary arm 518 to engage a surface of or an aperture of the primary arm 516.

The extendable lever 514 can be secured in the installed position through use of the lever securement feature 530. The lever securement feature 530 can be any suitable securement feature, such as a thumbscrew designed to engage a surface of or an aperture of the extendable lever 514 (e.g., a surface of or aperture of the secondary arm 518 and/or primary arm 516). Lever securement feature 530 can be coupled to the housing 502, such as via chassis coupling body 522, although other arrangements can be employed.

Figure 6:
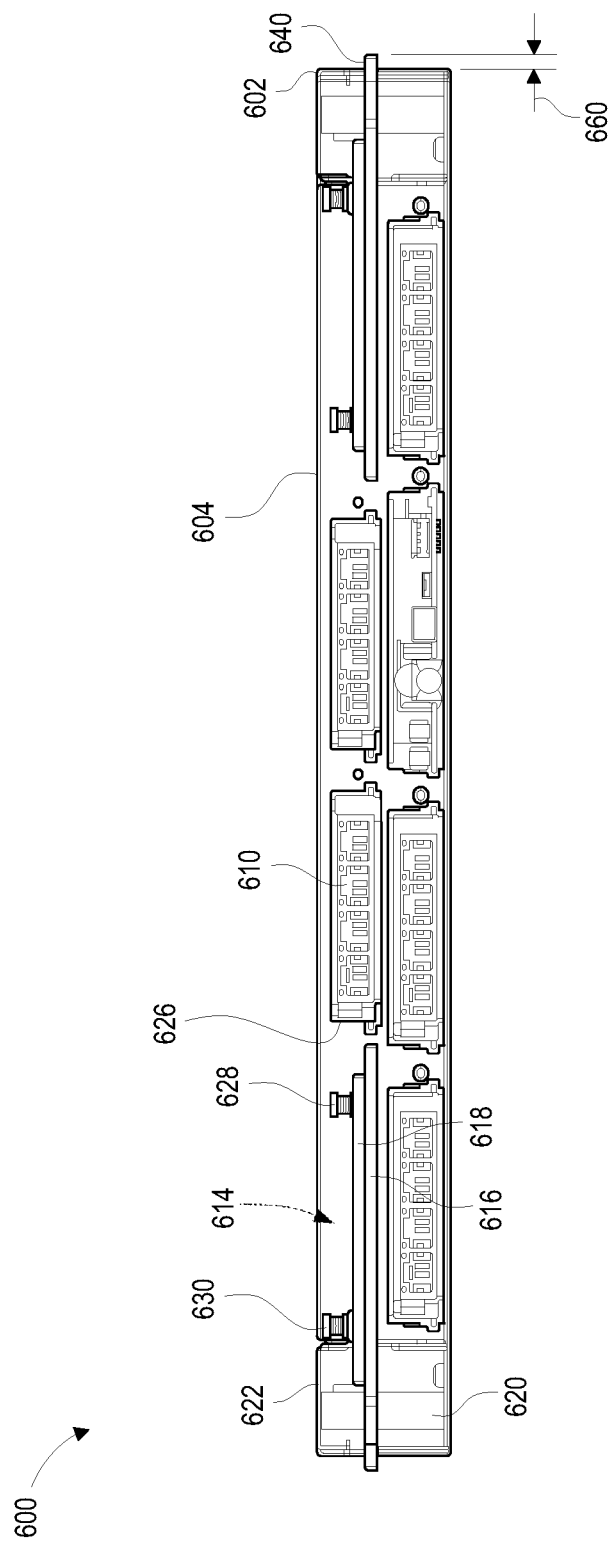
FIG. 6 is a front view of a sled with extendable levers in a retracted configuration and in an installed position, according to certain aspects of the present disclosure.

FIG. 6 is a front view of a sled 600 with extendable levers 614 in a retracted configuration and in an installed position, according to certain aspects of the present disclosure. Sled 600 can be the same as sled 500 of FIG. 5. The extendable levers 614 are depicted in the retracted configuration, with the secondary arm 618 positioned adjacent to the primary arm 616 and secured in place with securement feature 628. The extendable levers 614 are also depicted in the installed position, with the primary arm 616 positioned adjacent to cover 604 and with the extendable levers 614 secured in place with lever securement features 630.

The latching element 640 of the engaging feature of the extendable lever 614 is depicted as extending from the main body 620 of the extendable lever 614. When in the installed position, the latching element 640 extends beyond the boundaries of the housing 602, such as by a distance 660. When the sled 600 is installed in a chassis, at least a portion of the latching element 640 extending beyond the boundary of housing 602 can engage a corresponding feature in the chassis to secure the sled 600 within the chassis.

FIG. 7 is a top view of an extendable lever 714 with a slidable secondary arm 718 in a retracted position, according to certain aspects of the present disclosure. The extendable lever 714 includes a primary arm 716 that surrounds at least a portion of the secondary arm 718, thus slidably coupling the secondary arm 718 to the primary arm 716. Other arrangements can be used. A securement feature 728 can be used to secure the secondary arm 718 in the retracted position and/or the extended position.

The extendable lever 714 can include a main body 720 that rotates about pivot 724. The main body 720 can include an engaging feature 738 that can include a latching element 740 and/or a removal element 742.

The extendable lever 714 can include an aperture 732 (e.g., on the primary arm 716) to receive a lever securement feature used to secure the extendable lever 714 in an installed position.

When in the retracted configuration, extendable lever 714 can have a lever arm distance expressed as the distance from the center of pivot 724 to the distal end 744 of the secondary arm 718.

FIG. 8 is a top view of an extendable lever 814 with a slidable secondary arm 818 in an extended position, according to certain aspects of the present disclosure. Extendable lever 814 can be the same as extendable lever 714 of FIG. 7 after extension of secondary arm 718. Secondary arm 818 can be secured in place with respect to the primary arm 816 through the use of securement feature 828.

When in the expanded configuration, extendable lever 814 can have a lever arm distance expressed as the distance from the center of pivot 824 to the distal end 844 of the slidable secondary arm 818. The lever arm distance of extendable lever 814 of FIG. 8 is greater (e.g., longer) than the lever arm distance of extendable lever 714 of FIG. 7. The ability for an extendable lever to extend and provide a longer lever arm can provide a greater mechanical advantage for using the engaging features (e.g., latching element and/or removal element) of the extendable lever.

Figure 9:
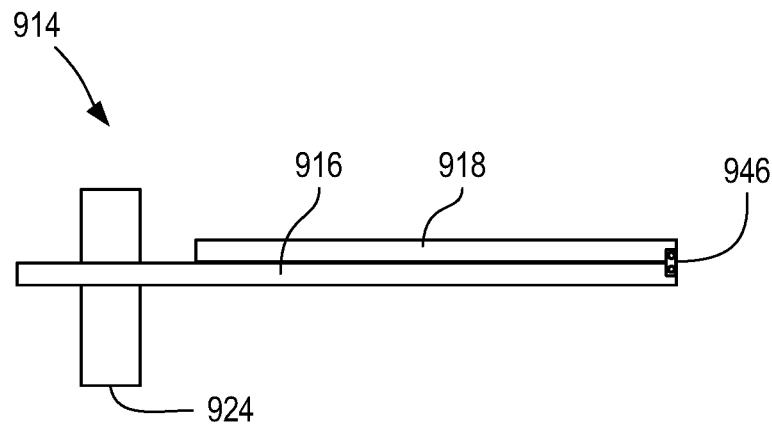
FIG. 9 is a front view of an extendable lever with a foldable secondary arm in a retracted position, according to certain aspects of the present disclosure.

FIG. 9 is a front view of an extendable lever 914 with a foldable secondary arm 918 in a retracted position, according to certain aspects of the present disclosure. When in the retracted position, the secondary arm 918 can rest upon the primary arm 916. The secondary arm 918 can be coupled to the primary arm 916, such as via a hinge 946. In some cases, the hinge 946 can be configured to permit folding movement of the secondary arm 918, as depicted with reference to FIGS. 9-11, while preventing the secondary arm 918 from rotating with respect to the primary arm 916 in an axis of rotation parallel to the axis of rotation of pivot 924. Extendable lever 914 can be similar to extendable lever 114 of FIG. 1, except for how the secondary arm 118 couples to and moves with respect to the primary arm 116.

Figure 10:
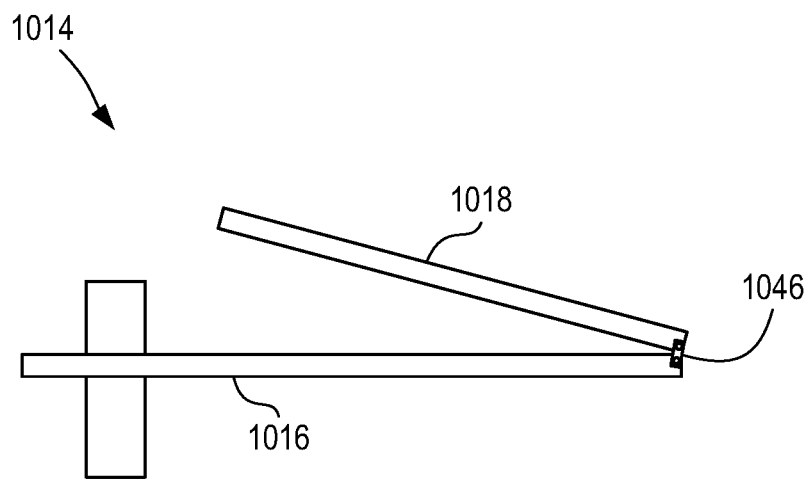
FIG. 10 is a front view of an extendable lever with a foldable secondary arm in a partially extended position, according to certain aspects of the present disclosure.

FIG. 10 is a front view of an extendable lever 1014 with a foldable secondary arm 1018 in a partially extended position, according to certain aspects of the present disclosure. Extendable lever 1014 can be the same as extendable lever 914 of FIG. 9 after the secondary arm 918 has been rotated away from the primary arm 916 about hinge 946. Secondary arm 1018 is coupled to primary arm 1016 via hinge 1046.

Figure 11:
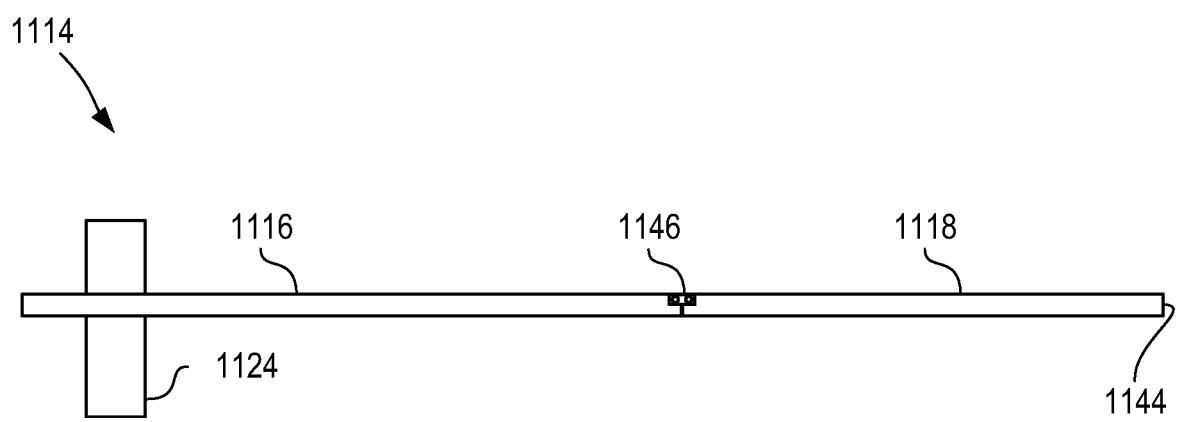
FIG. 11 is a front view of an extendable lever with a foldable secondary arm in an extended position, according to certain aspects of the present disclosure.

FIG. 11 is a front view of an extendable lever 1114 with a foldable secondary arm 1118 in an extended position, according to certain aspects of the present disclosure. Extendable lever 1114 can be the same as extendable lever 914 of FIG. 9 after the secondary arm 918 has been fully rotated away from the primary arm 916 about hinge 946. The secondary arm 1118 can be coupled to the primary arm 1116 via hinge 1146. In some cases, hinge 1146 is configured to permit the secondary arm 1118 to rotate until it is parallel or approximately parallel with primary arm 1116. Thus, the hinge 1146 can permit the secondary arm 1118 to stop in a position where its distal end 1144 is at its furthest point away from pivot 1124.

Figure 12:
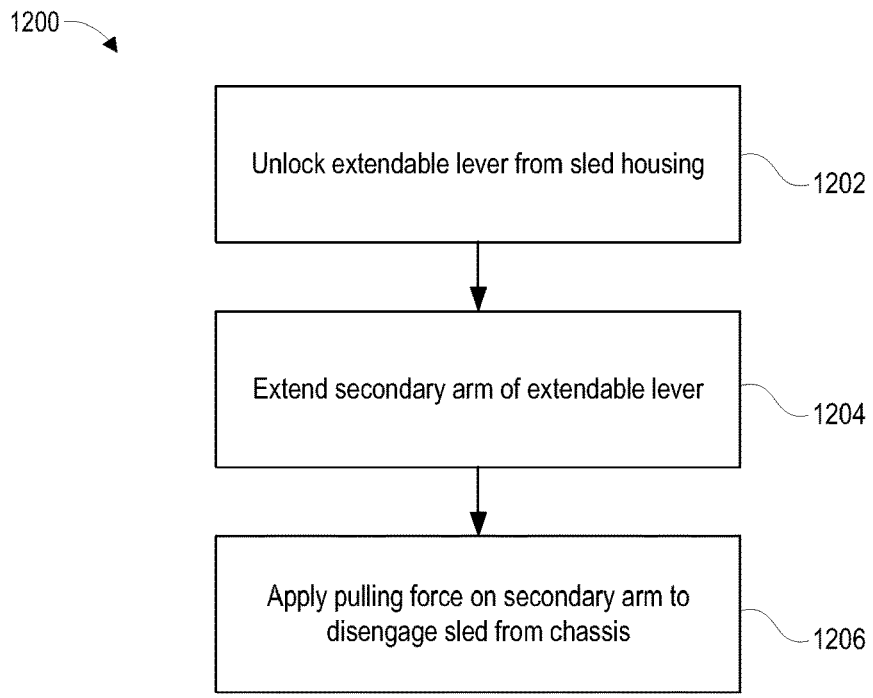
FIG. 12 is a flowchart depicting a process for removing a sled from a chassis, according to certain aspects of the present disclosure.

FIG. 12 is a flowchart depicting a process 1200 for removing a sled from a chassis, according to certain aspects of the present disclosure. Process 1200 can be used with any sleds as disclosed herein, such as sled 100 of FIG. 1.

At block 1202, the extendable lever can be unlocked from the sled housing. Unlocking the extendable lever from the sled housing can include unsecuring (e.g., unscrewing) a lever securement feature (e.g., a thumbscrew) while the extendable lever is in an installed position.

At block 1204, a secondary arm of the extendable lever can be extended. In some cases, extending the secondary arm at block 1204 can include unsecuring (e.g., unscrewing) a securement feature (e.g., a thumbscrew) that secures the secondary arm to the primary arm to permit the secondary arm to move to the extended position. In some cases, extending a secondary arm can include rotating or sliding the secondary arm with respect to the primary arm. In some cases, extending the secondary arm at block 1204 can include securing (e.g., screwing in) a securement feature (e.g., a thumbscrew) to secure the secondary arm to the primary arm when in the extended position.

At block 1206, a pulling force can be applied to the secondary arm to disengage the sled from the chassis. Disengaging the sled from the chassis can include applying a sufficient pulling force to retract a latching element of the extendable lever, thus permitting the sled to be extracted from the chassis. In some cases, disengaging the sled at block 1206 can include applying sufficient pulling force to cause a removal element of the extendable lever to engage a corresponding feature in the chassis to urge the sled out of the chassis. In some cases, the mechanical advantage afforded by the extendable lever can permit the removal element to engage the chassis with sufficient force to overcome connector removal forces of connectors at an opposite end of the sled.

Before or during block 1204 and/or block 1206, the extendable lever can be moved from the installed position to a removal position.

While removed from the chassis, the sled can be repaired or otherwise maintained before being inserted into the same or a different chassis.

Figure 13:
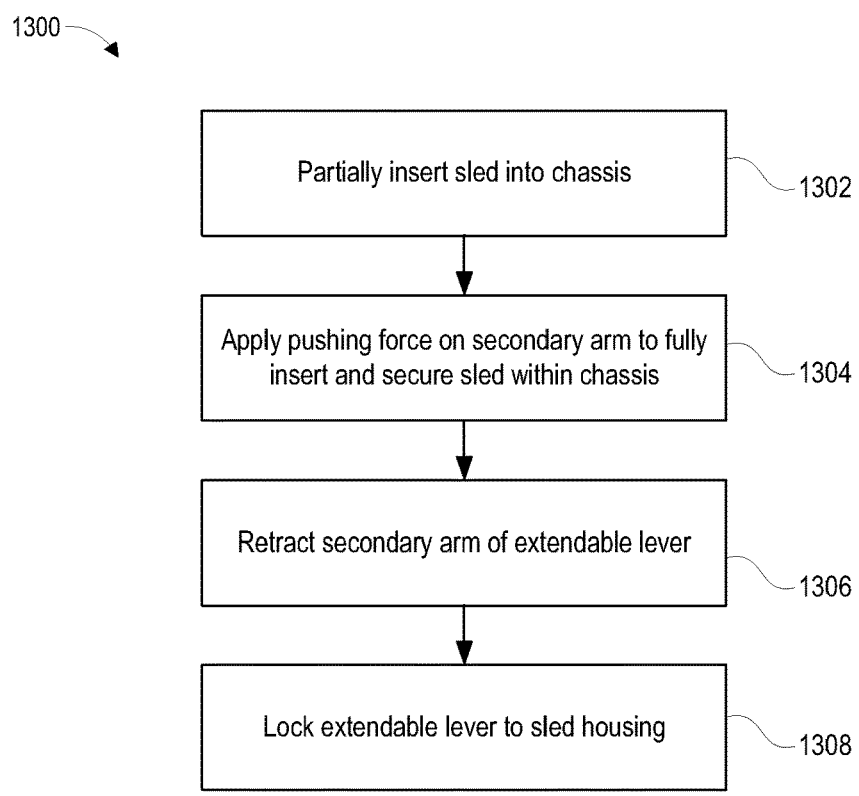
FIG. 13 is a flowchart depicting a process for inserting a sled into a chassis, according to certain aspects of the present disclosure.

FIG. 13 is a flowchart depicting a process 1300 for inserting a sled into a chassis, according to certain aspects of the present disclosure. Process 1300 can be used with any sleds as disclosed herein, such as sled 100 of FIG. 1.

At block 1302, the sled can be partially inserted into a receiving space within a chassis. In some cases, inserting the sled into the chassis at block 1302 can include inserting the sled sufficiently so the latching elements of the extendable lever pass corresponding features of the chassis. In some cases, inserting the sled into the chassis at block 1302 can include inserting the sled until substantial resistance is met.

At or before block 1304, the secondary arm of the extendable lever can be moved to an extended position.

At block 1304, pushing force can be applied to the secondary arm. Applying pushing force at block 1304 can cause the sled to be fully inserted into the chassis. In some cases, applying pushing force at block 1304 can cause a latching element of the extendable lever to engage corresponding features of the chassis and urge the sled into the chassis. In some cases, the mechanical advantage afforded by the extendable lever can permit the latching element to engage the chassis with sufficient force to overcome connector insertion forces of connectors at an opposite end of the sled.

At block 1306, a secondary arm of the extendable lever can be retracted. In some cases, retracting the secondary arm at block 1304 can include unsecuring (e.g., unscrewing) a securement feature (e.g., a thumbscrew) that secures the secondary arm to the primary arm to permit the secondary arm to move to the extended position. In some cases, retracting a secondary arm can include rotating or sliding the secondary arm with respect to the primary arm. In some cases, retracting the secondary arm at block 1204 can include securing (e.g., screwing in) a securement feature (e.g., a thumbscrew) to secure the secondary arm to the primary arm when in the retracted position.

At block 1308, the extendable lever can be locked to the sled housing, such as through a lever securement feature. The extendable lever can be locked to the sled housing in an installed position. When the extendable lever is locked in this installed position, the latching element can be positioned to secure the sled within the chassis, thus limiting removal of the sled until the extendable lever is unlocked from the sled housing, such as in block 1202 of process 1200 of FIG. 12.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the invention. Thus, the breadth and scope of the present invention should not be limited by any of the above described embodiments.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A sled, comprising:
  a housing for supporting a component having an interface, the housing insertable into a chassis;
  a cover panel positioned at an end of the housing, the cover panel having an opening for providing external access to the interface;
  a first extendable lever rotatably coupled to the housing adjacent a first side of the cover panel; and
  a second extendable lever rotatably coupled to the housing adjacent a second side of the cover panel that is opposite the first side of the cover panel;
  wherein each of the first extendable lever and the second extendable lever comprises:
    a lever body rotatable about a pivot;
    a primary arm extending from the lever body; and
    a secondary arm coupled to the primary arm and movable between a retracted position and an extended position, wherein the secondary arm is slidably coupled to the primary arm.

2. The sled of claim 1, wherein each of the first extendable lever and the second extendable lever is rotatable between a first position and a second position, and wherein rotation from the first position to the second position facilitates removal of the housing from the chassis.

3. The sled of claim 1, wherein each of the first extendable lever and the second extendable lever is rotatable between a first position and a second position, and wherein rotation from the second position to the first position facilitates securing the housing within the chassis.

4. The sled of claim 1, wherein each of the first extendable lever and the second extendable leaver further comprises an engaging feature for mechanically engaging the chassis in response to movement of the extendable lever.

5. The sled of claim 4, wherein each engaging feature comprises a latching element configured to engage a corresponding feature of the chassis to secure the housing within the chassis in response to rotation of the lever body in a direction that decreases a distance between the cover panel and the secondary arm.

6. The sled of claim 4, wherein each engaging feature comprises a removal feature configured to engage a corresponding feature of the chassis to facilitate removing the housing from the chassis in response to rotation of the lever body in a direction that increases a distance between the cover panel and the secondary arm.

7. The sled of claim 1, wherein each primary arm comprises a securement feature for releasably locking the secondary arm in the extended position.

8. The sled of claim 7, wherein the securement feature comprises a thumb screw, and wherein the secondary arm comprises a first aperture for receiving the thumb screw when in the extended position.

9. The sled of claim 7, wherein the secondary arm further comprises a second aperture for receiving the thumb screw when in the retracted position.

10. The sled of claim 1, further comprising a first lever securement feature and a second lever securement feature coupled to the housing, wherein each of the first lever securement feature and the second lever securement feature releasably locks the primary arm of respective ones of the first extendable lever and the second extendable lever in a first position.

11. The sled of claim 1, wherein the secondary arm of the first extendable lever restricts external access to the interface when in the extended position while the first extendable lever is rotated to an installed position.

12. The sled of claim 1, wherein each secondary arm does not restrict external access to the interface when in the retracted position.

13. A method, comprising:
  partially inserting a sled into a receiving space of a chassis, the sled comprising:
    a housing for supporting a component having an interface, the housing insertable into a chassis;
    a cover panel positioned at an end of the housing, the cover panel having an opening for providing external access to the interface;
    a first extendable lever rotatably coupled to the housing adjacent a first side of the cover panel; and
    a second extendable lever rotatably coupled to the housing adjacent a second side of the cover panel that is opposite the first side of the cover panel;
    wherein each of the first extendable lever and the second extendable lever comprises:

a lever body rotatable about a pivot;

a primary arm extending from the lever body; and a secondary arm coupled to the primary arm and movable between a retracted position and an extended position, wherein the secondary arm is slidably coupled to the primary arm;

applying pushing force to each secondary arm to fully insert and secure the sled within the chassis, wherein applying pushing force comprises rotating the respective primary arm towards the housing, and wherein rotating the primary arm towards the housing causes a respective securement feature of the extendable lever to engage the chassis;

retracting each secondary arm; and locking the first extendable lever and the second extendable lever to the housing.

14. The method of claim 13, further comprising:

unlocking the first extendable lever and the second extendable lever from the housing;

extending each secondary arm; and applying pulling force to each secondary arm to disengage the sled from the chassis, wherein applying pulling force comprises rotating the respective primary arm away from the housing.

15. The method of claim 13, wherein each of the first extendable lever and the second extendable lever comprises a securement feature for securing the secondary arm in the extended position, and wherein for each of the first extendable lever and the second extendable lever, retracting the secondary arm comprises disengaging the securement feature and rotating the secondary arm about a pivot.

16. The method of claim 13, wherein each of the first extendable lever and the second extendable lever comprises a securement feature for securing the secondary arm in the extended position, and wherein for each of the first extendable lever and the second extendable lever, retracting the secondary arm comprises disengaging the securement feature and sliding the secondary arm.

17. The method of claim 13, wherein each secondary arm does not restrict external access to the interface when in the retracted position.

* * * * *

UNITED STATES PATENT AND TRADEMARK OFFICE
CERTIFICATE OF CORRECTION

| | |
|---|---|
| PATENT NO. | : 11,266,035 B1 |
| APPLICATION NO. | : 17/006179 |
| DATED | : March 1, 2022 |
| INVENTOR(S) | : Yaw-Tzorng Tsorng et al. |

It is certified that error appears in the above-identified patent and that said Letters Patent is hereby corrected as shown below:

On the Title Page

Item (54), and In the Specification, Column 1, Line 1, should read:
EXTENDABLE CHASSIS LEVER Signed and Sealed this
Thirty-first Day of May, 2022

Katherine Kelly Vidal
*Director of the United States Patent and Trademark Office*